(12) United States Patent
Wang et al.

(10) Patent No.: US 12,727,257 B2
(45) Date of Patent: Sep. 1, 2026

(54) PHOTOVOLTAIC CELL PACKAGING STRUCTURE AND MANUFACTURING METHOD THEREOF

(71) Applicant: NANOBIT TECH. CO., LTD., Taoyuan City (TW)

(72) Inventors: Shuei-Chuan Wang, Taoyuan City (TW); Yuan-Hsiang Liu, Taoyuan City (TW); Hsiou-Ming Liu, Taoyuan City (TW); Ping-Feng Yu, Taoyuan City (TW)

(73) Assignee: NANOBIT TECH. CO., LTD., Taoyuan City (TW)

( * ) Notice: Subject to any disclaimer, the term of this patent is extended or adjusted under 35 U.S.C. 154(b) by 0 days.

(21) Appl. No.: 18/961,334

(22) Filed: Nov. 26, 2024

(65) Prior Publication Data

US 2026/0107580 A1 Apr. 16, 2026

(30) Foreign Application Priority Data

Oct. 11, 2024 (TW) ................................ 113138792

(51) Int. Cl.
*H10F 19/80* (2025.01)
*H10F 71/00* (2025.01)
*H10F 77/42* (2025.01)

(52) U.S. Cl.
CPC ............. *H10F 19/80* (2025.01); *H10F 71/00* (2025.01); *H10F 77/488* (2025.01)

(58) Field of Classification Search
CPC ...... H10F 19/80; H10F 19/804; H10F 19/807; H10F 77/488; H10F 71/00
See application file for complete search history.

(56) References Cited

U.S. PATENT DOCUMENTS

2005/0000561 A1* 1/2005 Baret .................... H10F 77/215 136/244
2005/0161075 A1* 7/2005 Ogawa .................... H10F 19/80 136/251

(Continued)

FOREIGN PATENT DOCUMENTS

CN 102484165 A 5/2012
CN 111223964 A 6/2020

(Continued)

OTHER PUBLICATIONS

Machine translation of EP-2631389-A1, Braunagel Andreas. (Year: 2013).*

*Primary Examiner* — Mayla Gonzalez Ramos
(74) *Attorney, Agent, or Firm* — HDLS IPR SERVICES; Chun-Ming Shih

(57) ABSTRACT

A photovoltaic cell packaging structure includes: a first transparent cover; a first lower conductive layer, disposed on a side of the first transparent cover; a first photovoltaic unit, disposed on a side of the first lower conductive layer; a first upper conductive layer, disposed on a side of the first photovoltaic unit; a packaging layer, disposed peripherally on the first transparent cover; an adhesive layer, disposed peripherally on the first transparent cover and disposed adjacent to the packaging layer; and a second transparent cover, disposed on the packaging layer and the adhesive layer, and contacting with the first upper conductive layer. A packaging area is defined by the first transparent cover, the second transparent cover, and the packaging layer.

12 Claims, 5 Drawing Sheets

(56) References Cited

U.S. PATENT DOCUMENTS

| | | | | |
|---|---|---|---|---|
| 2012/0080065 | A1* | 4/2012 | Krajewski | H10F 19/80<br>257/E21.705 |
| 2014/0305496 | A1 | 10/2014 | Nam | |
| 2017/0358699 | A1* | 12/2017 | Juliano | H10F 19/80 |
| 2020/0266311 | A1* | 8/2020 | Chan | H10F 19/80 |
| 2022/0254942 | A1 | 8/2022 | Li et al. | |

FOREIGN PATENT DOCUMENTS

| | | | | |
|---|---|---|---|---|
| CN | 211480051 | U | 9/2020 | |
| CN | 112670360 | A | 4/2021 | |
| CN | 219917183 | U | 10/2023 | |
| CN | 117042475 | A | 11/2023 | |
| CN | 117650186 | A | 3/2024 | |
| EP | 2631389 | A1 * | 8/2013 | H10F 19/80 |
| TW | M440531 | U | 11/2012 | |
| TW | M656331 | U | 6/2024 | |

* cited by examiner

PHOTOVOLTAIC CELL PACKAGING STRUCTURE AND MANUFACTURING METHOD THEREOF

BACKGROUND OF THE DISCLOSURE

Technical Field

The present disclosure relates to a photovoltaic cell packaging structure, particularly relates to a photovoltaic cell packaging structure that is easy to package and has a stable structure.

Description of Related Art

As people become more aware of green energy and environmental protection, solar energy technology continues to evolve. Solar cells may be combined with household items and provide electricity for household items. Solar cells may be combined, for example, with computers and their peripherals, communication and consumer electronics products, or, for example, with buildings, to fully utilize solar energy for green energy and environmental protection purposes.

Thin-film solar cells are thinner and lighter than monocrystalline silicon or polycrystalline silicon solar cells. Thin-film solar cells, such as organic solar cells, copper indium gallium diselenide (CIGS) solar cells, or perovskite solar cells (PSC) solar cells, may be manufactured through vaporization, coating, and other technologies to make the thin-film solar cells with better flatness and uniformity. Thin-film solar cells may be manufactured through the roll-to-roll (R2R) process. Since the roll-to-roll process may manufacture thin-film solar cells on a large area, new forms of solar cells with malleable, lightweight, and impact resistance may be produced at a lower cost.

Generally, the packaging steps of thin-film solar cells are: step 1, coating a glass glue to a second transparent cover of the thin-film solar cells; step 2, placing a first transparent cover and the second transparent cover into a vacuum environment; step 3, aligning through the fixture and temporarily bonding the first transparent cover and the second transparent cover; and step 4, in the vacuum environment, heating the glass glue to make the first transparent cover, the second transparent cover and the glass glue to form a packaging area.

However, in these steps, the first transparent cover and the second transparent cover are prone to displacement. As a result, the first transparent cover and the second transparent cover may be misaligned with each other. Moreover, since step 4 includes heating the glass glue in the vacuum environment, that makes a laser heating operation be more complicated. Moreover, the packaged product of the thin-film solar cells only supports the first transparent cover and the second transparent cover of the thin-film solar cells through the glass glue. Since the packaging area is a vacuum, the first transparent cover and the second transparent cover may be deformed due to a pressure difference. If a filling layer material is filled in the packaging area to support the first transparent cover and the second transparent cover of the thin-film solar cells, apart from the increasing of cost, the filling layer material may damage the photovoltaic layer.

In view of this, how to improve the photovoltaic cell packaging structure and the manufacturing method thereof, so that the alignment offset of the first transparent cover and the second transparent cover is reduced, the glass glue does not require heating in the vacuum environment, the first transparent cover and the second transparent cover are structurally solid and resistant to deformation and do not require the additional filling layer material, is one of the current problems that need to be solved.

SUMMARY OF THE DISCLOSURE

The present disclosure provides the photovoltaic cell packaging structure and the manufacturing method thereof to make the alignment of the first transparent cover and the second transparent cover be precise, make the glass glue be heated in a normal pressure environment, make the first transparent cover and the second transparent cover be structurally stable and difficult to be deformed without additional filling layer material.

The present disclosure provides a photovoltaic cell packaging structure, including: a first transparent cover; a first lower conductive layer, disposed on a side of the first transparent cover; a first photovoltaic unit, disposed on a side of the first lower conductive layer; a first upper conductive layer, disposed on a side of the first photovoltaic unit; a packaging layer, disposed peripherally on the first transparent cover; an adhesive layer, disposed peripherally on the first transparent cover and disposed adjacent to the packaging layer; and a second transparent cover, disposed on the packaging layer and the adhesive layer, and contacting with the first upper conductive layer; wherein, a packaging area is defined by the first transparent cover, the second transparent cover, and the packaging layer.

In some embodiments, the adhesive layer is disposed inside the packaging layer and arranged in the packaging area.

In some embodiments, the adhesive layer is disposed outside the packaging layer and arranged outside the packaging area.

In some embodiments, a thickness of the adhesive layer is equal to or greater than 10 μm and equal to or less than 500 μm.

In some embodiments, a thickness of the packaging layer is equal to or greater than 10 μm and equal to or less than 500 μm.

In some embodiments, a thickness of the first upper conductive layer is equal to or greater than 0.1 μm and equal to or less than 500 μm.

In some embodiments, a thickness of the first lower conductive layer is equal to or greater than 0.05 μm and equal to or less than 10 μm.

In some embodiments, a thickness of the first photovoltaic unit is equal to or greater than 0.1 μm and equal to or less than 10 μm.

In some embodiments, the photovoltaic cell packaging structure, further including: a second lower conductive layer, disposed on the side of the first transparent cover, disposed adjacent to the first lower conductive layer, and electrically connected to the first upper conductive layer; a second photovoltaic unit, disposed on a side of the second lower conductive layer; and an insulation layer, disposed between the first photovoltaic unit and the second photovoltaic unit; wherein, a thickness of the insulation layer is equal to or greater than 0.1 μm and equal to or less than 500 μm.

In some embodiments, the adhesive layer is a polyolefin elastomer (POE), an ionomer, an ethylene vinyl acetate (EVA), a polyurethane (PU), a polyvinyl butyral (PVB), or a polyisobutylene (PIB).

In some embodiments, the photovoltaic cell packaging structure, further including: a reflective layer, disposed on the first photovoltaic unit.

In some embodiments, the photovoltaic cell packaging structure, further including: an gas suction unit, disposed in the packaging area.

The present disclosure provides a manufacturing method of a photovoltaic cell packaging structure, the manufacturing method including: coating a packaging layer on a side of a first transparent cover or a side of a second transparent cover; baking the packaging layer to connect the packaging layer with the first transparent cover or the second transparent cover; attaching an adhesive layer to the side of the first transparent cover or the side of the second transparent cover; aligning the first transparent cover and the second transparent cover; placing the first transparent cover, the second transparent cover, the packaging layer, and the adhesive layer into a vacuum environment; heating and pressing the first transparent cover and the second transparent cover to connect the adhesive layer with the first transparent cover and the second transparent cover; and heating the packaging layer to connect the packaging layer with the first transparent cover and the second transparent cover.

In some embodiments, between the heating and pressing of the first transparent cover and the second transparent cover to connect the adhesive layer with the first transparent cover and the second transparent cover and the heating of the packaging layer to connect the packaging layer with the first transparent cover and the second transparent cover, the manufacturing method further includes: placing the first transparent cover, the second transparent cover, the packaging layer, and the adhesive layer into a normal pressure environment.

In some embodiments, the coating of the packaging layer on the side of the first transparent cover or the side of the second transparent cover further includes: coating the packaging layer with a thickness of equal to or greater than 15 μm and equal to or less than 25 μm on the side of the first transparent cover or the side of the second transparent cover; wherein, the baking of the packaging layer to connect the packaging layer with the first transparent cover or the second transparent cover further including: baking the packaging layer to make the thickness of the packaging layer be about 20 μm to connect the packaging layer with the first transparent cover or the second transparent cover.

In some embodiments, the baking of the packaging layer to connect the packaging layer with the first transparent cover or the second transparent cover further includes: baking the packaging layer at a temperature of equal to or greater than 200° C. and equal to or less than 500° C. for equal to or greater than 90 minutes and equal to or less than 120 minutes to connect the packaging layer with the first transparent cover or the second transparent cover.

In some embodiments, between the baking of the packaging layer to connect the packaging layer with the first transparent cover or the second transparent cover and the attaching of the adhesive layer to the side of the first transparent cover or the side of the second transparent cover, the manufacturing method further includes: placing the first transparent cover or the second transparent cover and the packaging layer into a normal temperature environment.

In some embodiments, the attaching of the adhesive layer to the side of the first transparent cover or the side of the second transparent cover further includes: attaching the adhesive layer to the side of the first transparent cover or the side of the second transparent cover, wherein, a thickness of the adhesive layer is 1.0 time to 2.0 times greater than a thickness of the packaging layer.

In some embodiments, the placing of the first transparent cover, the second transparent cover, the packaging layer, and the adhesive layer into the vacuum environment further includes: placing the first transparent cover, the second transparent cover, the packaging layer, and the adhesive layer into the vacuum environment with an air pressure equal to or less than $10^{-1}$ Torr.

In some embodiments, the heating and pressing of the first transparent cover and the second transparent cover to connect the adhesive layer with the first transparent cover and the second transparent cover further includes: heating and pressing the first transparent cover and the second transparent cover at a temperature of equal to or greater than 80° C. and equal to or less than 150° C. for equal to or greater than 5 minutes and less than or equal to and equal to or less than 10 minutes to make a thickness of the adhesive layer be same with a thickness of the packaging layer to connect the adhesive layer with the first transparent cover and the second transparent cover.

In summary, the first transparent cover, the second transparent cover, the adhesive layer, and the packaging layer of the photovoltaic cell packaging structure of the present disclosure may maintain the vacuum of the packaging area to achieve the effect of blocking water and gas. The first upper conductive layer or the insulation layer may evenly support the first transparent cover and the second transparent cover inside the packaging area to make the structure of the photovoltaic cell packaging structure be stable and difficult to be deformed, make the thickness uniformity increase, and make the alignment of the first transparent cover and the second transparent cover be precise without additional filling layer material.

Moreover, the thickness of the adhesive layer of the photovoltaic cell packaging structure of the present disclosure is equal to or greater than 10 μm and equal to or less than 500 μm. As a result, the photovoltaic cell packaging structure may temporarily maintain the vacuum of the packaging area during manufacturing, and the packaging layer may be heated in a normal pressure environment. The thickness of the packaging layer is equal to or greater than 10 μm and equal to or less than 500 μm to support the first transparent cover and the second transparent cover. The thickness of the first upper conductive layer is equal to or greater than 0.1 μm and equal to or less than 500 μm and the thickness of the insulation layer is equal to or greater than 10 μm and equal to or less than 500 μm to evenly support the first transparent cover and the second transparent cover. The thickness of the first lower conductive layer is equal to or greater than 0.05 μm and equal to or less than 10 μm for being disposed inside the packaging area to facilitate manufacturing. The thickness of the first photovoltaic unit is equal to or greater than 0.1 μm and equal to or less than 10 μm for being disposed inside the packaging area to facilitate manufacturing.

The manufacturing method of the photovoltaic cell packaging structure of the present disclosure is using the adhesive layer to temporarily bond the first transparent cover and the second transparent cover and maintain the packaging area in the vacuum state. As a result, the packaging layer may be heated in the normal pressure environment to reduce the complexity of the laser heating process. The packaging area may be maintained in a vacuum state of at least $10^{-1}$ Torr to achieve the effect of water and gas blocking. The alignment error of the first transparent cover and the second transparent cover may be controlled to equal to or less than 5 μm.

It should be noted that in this description, the "-" symbol indicates a range of values that includes the values before and after it.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

As used in the present disclosure, terms such as "first", "second" are employed to describe various elements, components, regions, layers, and/or parts. These terms should not be construed as limitations on the mentioned elements, components, regions, layers, and/or parts. Instead, they are used merely for distinguishing one element, component, region, layer, or part from another. Unless explicitly indicated in the context, the usage of terms such as "first", "second" does not imply any specific sequence or order.

Figure 1:
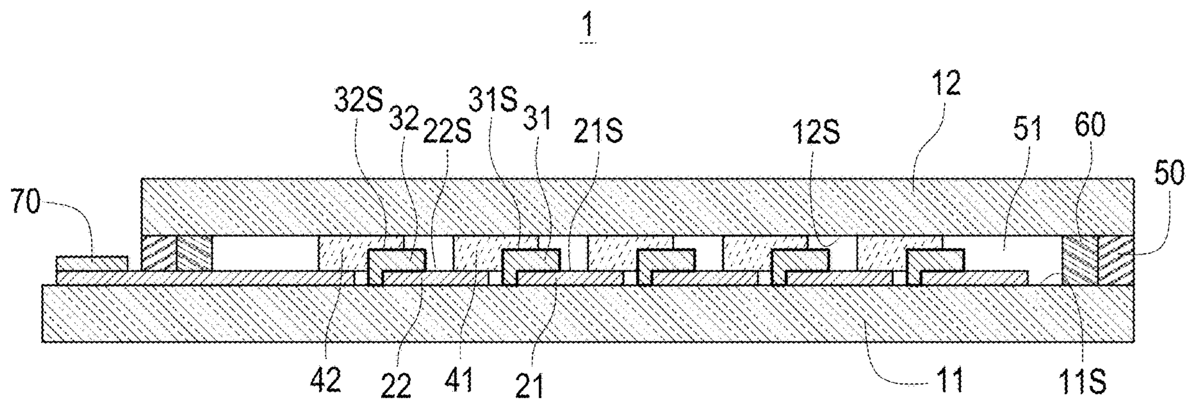
FIG. 1 is a schematic diagram of a cross-section of the photovoltaic cell packaging structure in accordance with an embodiment of the present disclosure.
Figure 2:
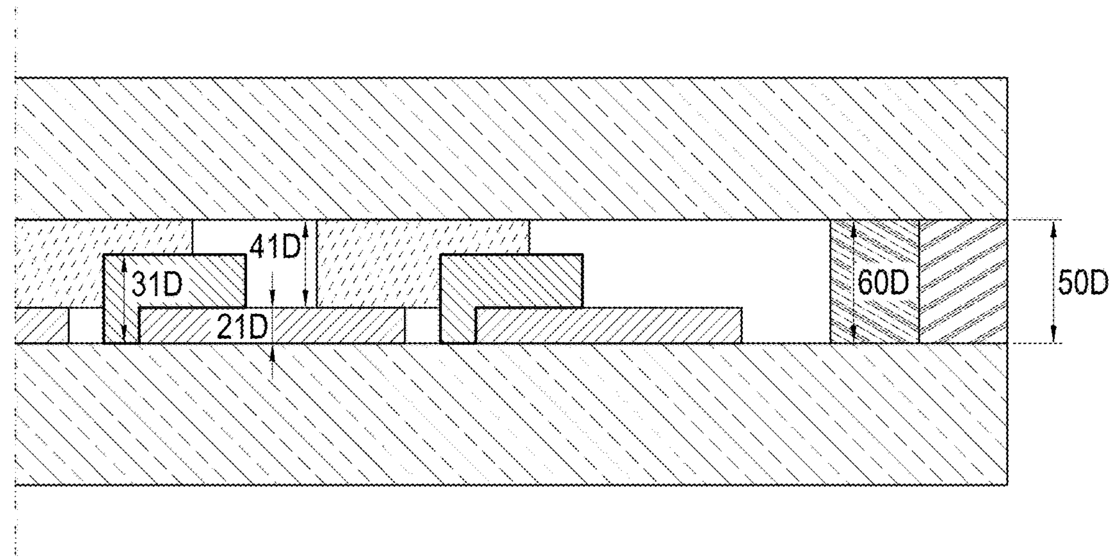
FIG. 2 is a schematic diagram of a partial cross-section of the photovoltaic cell packaging structure in accordance with an embodiment of the present disclosure.
Figure 3:
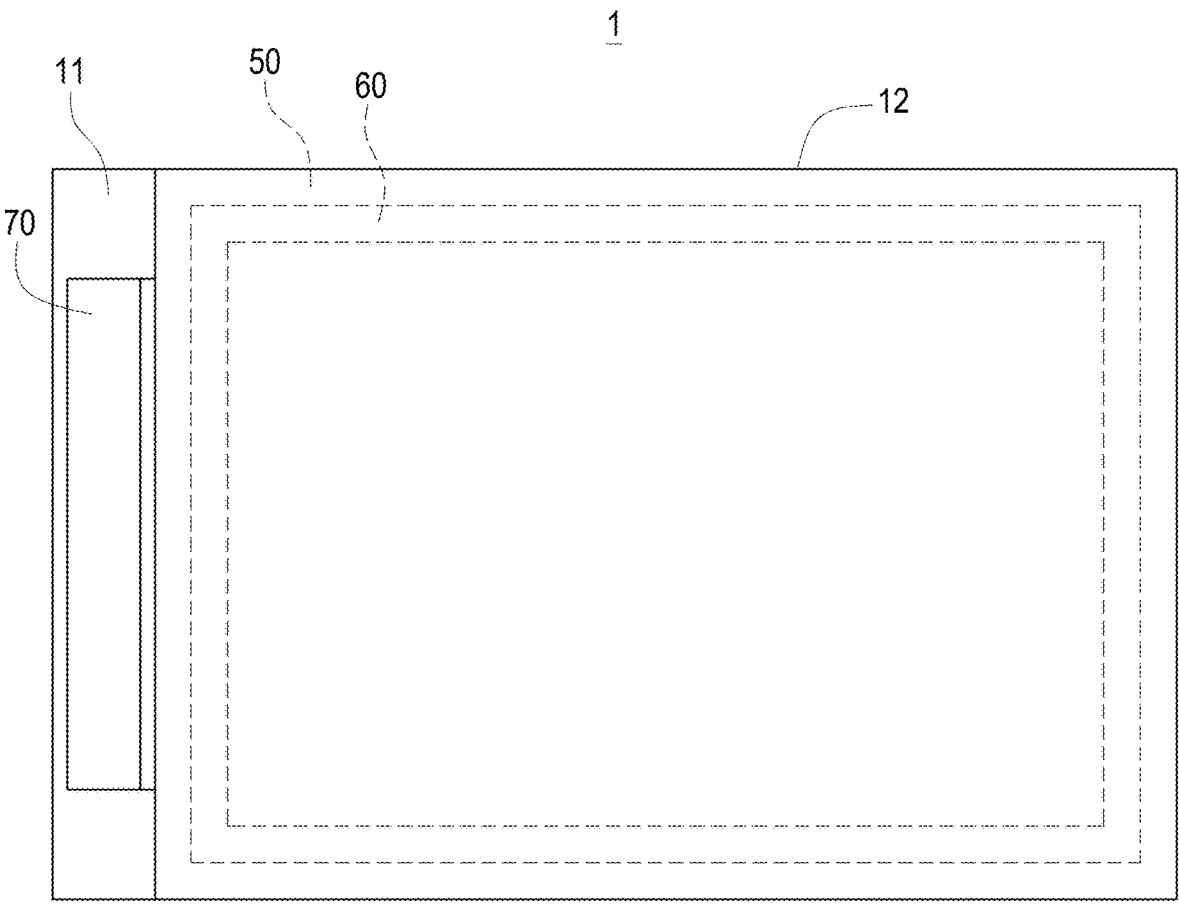
FIG. 3 is a schematic diagram of cross-section of the photovoltaic cell packaging structure from another perspective in accordance with an embodiment of the present disclosure.

FIG. 1 is a schematic diagram of a cross-section of the photovoltaic cell packaging structure in accordance with the first embodiment of the present disclosure. FIG. 2 is a schematic diagram of a partial cross-section of the photovoltaic cell packaging structure in accordance with an embodiment of the present disclosure. FIG. 3 is a schematic diagram of cross-section of the photovoltaic cell packaging structure from another perspective in accordance with an embodiment of the present disclosure. Please refer to FIG. 1, FIG. 2, and FIG. 3, the embodiment of the photovoltaic cell packaging structure 1 includes a first transparent cover 11, a first lower conductive layer 21, a first photovoltaic unit 31, a first upper conductive layer 41, a packaging layer 50, an adhesive layer 60 and a second transparent cover 12.

The first transparent cover 11 is a light-transmitting plastic substrate or a light-transmitting glass substrate. Translucent plastics may be, for example, a polyimide (PI), a hybrid polyimide (hybrid PI), a polyethylene terephthalate (PET), a polyethersulfone (PES), a polyethylene naphthalate (PEN), a cyclo olefin polymer (COP), or a fiberglass reinforced plastic substrate.

The first lower conductive layer 21 is disposed on a side 11S of the first transparent cover 11. The first lower conductive layer 21 may be a transparent electrode circuit formed on a side 11S of the first transparent cover 11 through etching technology by using indium tin oxide (ITO), silver glue, or other inorganic conductive materials. The first lower conductive layer 21 may also be a transparent electrode circuit formed on the side 11S of the first transparent cover 11 through coating, sputtering, or evaporation technology. The material of the first lower conductive layer 21 may be a multi-layer combination of conductive polymer, metal oxide, metal, and metal oxide. In some embodiments, the light transmittance of the first lower conductive layer 21 may be equal to or greater than 70% and be equal to or less than 95%, so that the sunlight may penetrate the first lower conductive layer 21. In some embodiments, a thickness 21D of the first lower conductive layer 21 is equal to or greater than 0.05 μm and equal to or less than 10 μm. In some embodiments, the first lower conductive layer 21 may protrude from the packaging layer 50 and the adhesive layer 60 to be the external pins of the photovoltaic cell packaging structure 1.

The first photovoltaic unit 31 is disposed on a side 21S of the first lower conductive layer 21. The first photovoltaic unit 31 is, for example, disposed on one side 21S or multiple sides 21S of the first lower conductive layer 21. The first photovoltaic unit 31 may be disposed on the side 21S of the first lower conductive layer 21 through, for example, laser etching. The first photovoltaic unit 31 sequentially includes an electron transport layer, an active layer, and an electron hole. The first photovoltaic unit 31 may be, for example, an organic solar cell, a copper indium gallium diselenide (CIGS) thin-film solar cell, a cadmium telluride (CdTe) thin-film solar cell, an amorphous silicon (α-Si) thin-film solar cell, a perovskite thin-film solar cell or a dye sensitized solar cell (DSSC). In some embodiments, a thickness 31D of the first photovoltaic unit 31 is equal to or greater than 0.1 μm and equal to or less than 10 μm.

The first upper conductive layer 41 is disposed on a side 31S of the first photovoltaic unit 31. The first upper conductive layer 41 is, for example, disposed on one side 31S or multiple sides 31S of the first photovoltaic unit 31. The first upper conductive layer 41 may be an electrode circuit formed on the side 31S of the first photovoltaic unit 31 through silver glue screen printing and laser etching. The first upper conductive layer 41 may also be an electrode circuit formed on the side 31S of the first photovoltaic unit 31 through coating, sputtering, or evaporation technology. The material of the first upper conductive layer 41 may be a multi-layer combination of conductive polymer, metal oxide, metal, and metal oxide. In some embodiments, the thickness of the silver glue may be equal to or greater than 10 μm and equal to or less than 20 μm to support the second transparent cover 12. In some embodiments, a thickness 41D of the first upper conductive layer 41 is equal to or greater than 0.1 μm and equal to or less than 500 μm to support the second transparent cover 12.

The packaging layer 50 is disposed peripherally on the first transparent cover 11. A cross-sectional shape of the packaging layer 50 is, for example, a square, rectangular, circular, or other closed ring shape, to be disposed peripherally on the first transparent cover 11. The material of the packaging layer 50 is, for example, a glass glue, a polyurethane (PU), an ethylene vinyl acetate (EVA), a polyvinyl butyral (PVB), or a polyisobutylene (PIB). In some embodiments, a thickness 50D of the packaging layer 50 is equal to or greater than 10 μm and equal to or less than 500 μm to support the first transparent cover 11 and the second transparent cover 12.

An adhesive layer 60 is disposed peripherally on the first transparent cover 11 and adjacent to the packaging layer 50. A cross-sectional shape of the adhesive layer 60 is, for example, a square, rectangular, circular, or other closed ring shape, to be disposed peripherally on the first transparent cover 11. The adhesive layer 60 may contact the packaging layer 50 or may not contact the packaging layer 50. In some embodiments, the adhesive layer 60 is disposed inside the packaging layer 50 and arranged in the packaging area 51. In other words, the packaging layer 50 wraps (encloses) the adhesive layer 60. In some embodiments, the adhesive layer 60 is disposed outside the packaging layer 50 and arranged outside the packaging area 51. In other words, the adhesive layer 60 wraps (encloses) the packaging layer 50. The shape of the adhesive layer 60 may be changed when being heated and pressed, to make the thickness 60D of the adhesive layer 60 be the same as the packaging layer 50. In some embodiments, a thickness 60D of the adhesive layer 60 is equal to or greater than 10 μm and equal to or less than 500 μm for temporarily attaching (bonding) the first transparent cover 11 and the second transparent cover 12 to maintain the packaging area 51 in a vacuum state. In some embodiments, the adhesive layer 60 is a polyolefin elastomer (POE), an ionomer, an ethylene vinyl acetate (EVA), a polyurethane (PU), a polyvinyl butyral (PVB), or a polyisobutylene (PIB). In some embodiments, the adhesive layer 60 is polyolefin elastomer (POE). Since the adhesive layer 60 is a dry film, the adhesive layer 60 may be cut and disposed peripherally on the first transparent cover 11.

A second transparent cover 12 is disposed on the packaging layer 50 and the adhesive layer 60, and contacts the first upper conductive layer 41. In other words, the second transparent cover 12 is in contact with the packaging layer 50, the adhesive layer 60, and the first upper conductive layer 41 to support the first transparent cover 11 and the second transparent cover 12. The packaging layer 50 is disposed peripherally on and in contact with the first transparent cover 11 and the second transparent cover 12. As a result, the packaging area 51 is defined by the first transparent cover 11, the second transparent cover 12, and the packaging layer 50. The material of the second transparent cover 12 is similar to the material of the first transparent cover 11, here is omitted for brevity.

In some embodiments, the photovoltaic cell packaging structure 1 may further include a second lower conductive layer 22, a second photovoltaic unit 32, a second upper conductive layer 42, an insulation layer (not shown in the figures), a reflective layer (not shown in the figures), a gas suction unit (not shown in the figures) and an electrode lead 70.

The second lower conductive layer 22 is disposed on the side 11S of the first transparent cover 11, disposed adjacent to the first lower conductive layer 21, and electrically connected to the first upper conductive layer 41. The second photovoltaic unit 32 is disposed on a side 22S of the second lower conductive layer 22. The second upper conductive layer 42 is disposed on a side 32S of the second photovoltaic unit 32. The components and arrangement of the second lower conductive layer 22, the second photovoltaic unit 32, and the second upper conductive layer 42 are similar to the components and arrangement of the first lower conductive layer 21, the first photovoltaic unit 31 and the first upper conductive layer 41. The difference is that the second lower conductive layer 22 is arranged beside the first lower conductive layer 21 and electrically connected to the first upper conductive layer 41 to create the effect of batteries in series.

The insulation layer is disposed between the first photovoltaic unit 31 and the second photovoltaic unit 32. The insulation layer, for example, may or may not be in contact with the first photovoltaic unit 31 and the second photovoltaic unit 32 to avoid the first photovoltaic unit 31 and the second photovoltaic unit 32 forming a short circuit. A thickness of the insulation layer is equal to or greater than 0.1 μm and equal to or less than 500 μm to support the first transparent cover 11 and the second transparent cover 12.

The reflective layer is disposed on the first photovoltaic unit 31. The reflective layer may be formed, for example, through the vapor deposition of aluminum or silver on the first photovoltaic unit 31. As a result, sunlight that is not absorbed through the first photovoltaic unit 31 may be reflected back to the first photovoltaic unit 31 to increase sunlight utilization.

An gas suction unit is disposed in the packaging area 51. The gas suction unit may be, for example, used to capture gas or collect gas. The gas suction unit may be, for example, a getter. The material of the gas suction unit is metal, alloy, or other adsorbent material and may absorb air, water vapor, or other gases. As a result, gases generated during a process of heating the packaging layer 50, such as gases volatilized through laser sintering the glass glue, destroy other components in the packaging area 51 may be prevented.

The electrode lead 70 may, for example, be disposed on the first transparent cover 11 or the first lower conductive layer 21, electrically connected to the first lower conductive layer 21, and includes a cable wiring area. In some embodiments, the electrode lead 70 may be electrically connected to the first lower conductive layer 21 outside the packaging area 51 through attaching or binding. In some embodiments, the material of the electrode lead 70 may be a flexure circuit board (FPC), printed copper foil, printed copper wire, or printed silver glue.

In summary, the first transparent cover 11, the second transparent cover 12, the adhesive layer 60, and the packaging layer 50 of the photovoltaic cell packaging structure 1 of the present disclosure may maintain the vacuum of the packaging area 51 to achieve the effect of blocking water and gas. The first upper conductive layer 41 or the insulation layer may evenly support the first transparent cover 11 and the second transparent cover 12 inside the packaging area 51 to make the structure of the photovoltaic cell packaging structure 1 be stable and difficult to be deformed, make the thickness uniformity increase, and make the alignment of the first transparent cover 11 and the second transparent cover 12 be precise without additional filling layer material.

Moreover, the thickness 60D of the adhesive layer 60 of the photovoltaic cell packaging structure 1 of the present disclosure is equal to or greater than 10 μm and equal to or less than 500 μm. As a result, the photovoltaic cell packaging structure 1 may temporarily maintain the vacuum of the packaging area 50 during manufacturing, and the packaging layer 50 may be heated in a normal pressure environment. The thickness 50D of the packaging layer 50 is equal to or greater than 10 μm and equal to or less than 500 μm to support the first transparent cover 11 and the second transparent cover 12. The thickness 41D of the first upper conductive layer 41 is equal to or greater than 0.1 μm and equal to or less than 500 μm and the thickness of the insulation layer is equal to or greater than 10 μm and equal to or less than 500 μm to evenly support the first transparent cover 11 and the second transparent cover 12. The thickness 21D of the first lower conductive layer 21 is equal to or greater than 0.05 μm and equal to or less than 10 μm for being disposed inside the packaging area 51 to facilitate manufacturing. The thickness 31D of the first photovoltaic unit 31 is equal to or greater than 0.1 μm and equal to or less than 10 μm for being disposed inside the packaging area 51 to facilitate manufacturing.

Figure 4A:
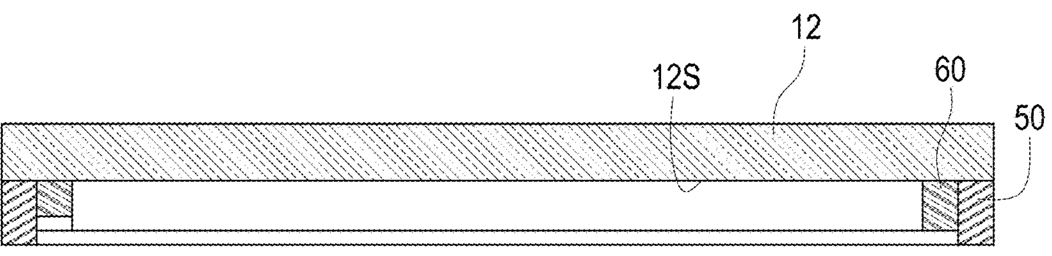
FIG. 4A is a schematic diagram of the manufacturing status of the photovoltaic cell packaging structure in accordance with an embodiment of the present disclosure.
Figure 4B:
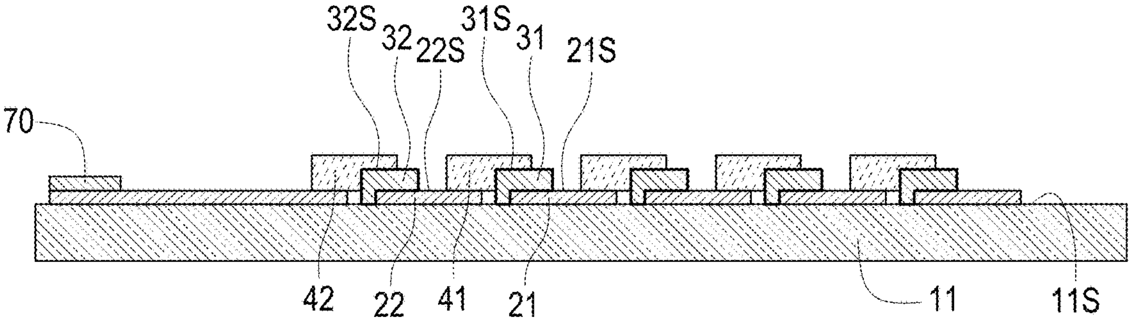
FIG. 4B is a schematic diagram of manufacturing status of the photovoltaic cell packaging structure in accordance with an embodiment of the present disclosure.
Figure 5:
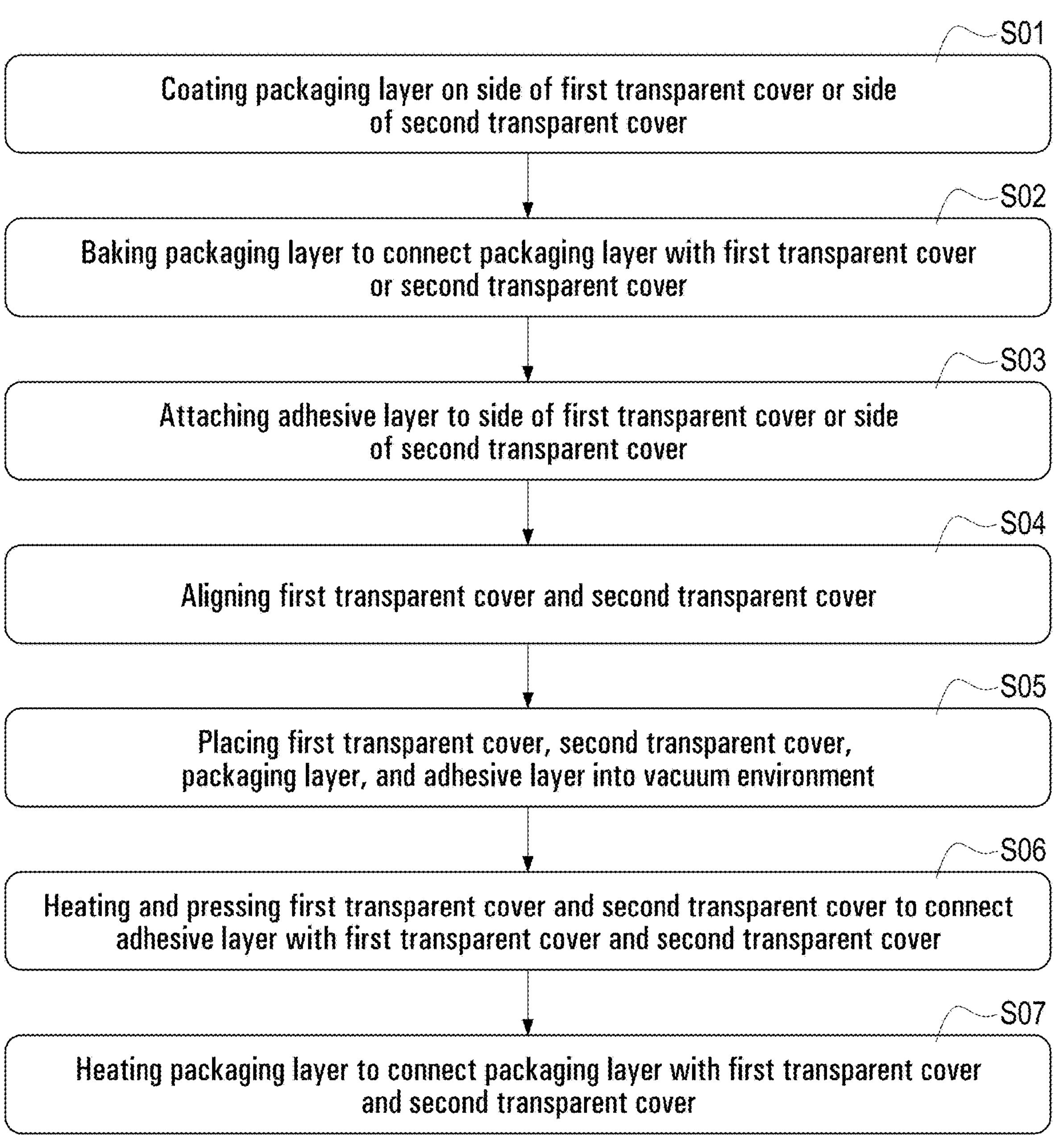
FIG. 5 is a flowchart of the manufacturing method of the photovoltaic cell packaging structure in accordance with an embodiment of the present disclosure.

FIG. 4A is a schematic diagram of the manufacturing status of the photovoltaic cell packaging structure in accordance with an embodiment of the present disclosure. FIG. 4B is a schematic diagram of the manufacturing status of the photovoltaic cell packaging structure in accordance with an embodiment of the present disclosure. FIG. 5 is a flowchart of the manufacturing method in accordance with an embodiment of the present disclosure. Please refer to FIG. 1, FIG. 2, FIG. 4A, FIG. 4B and FIG. 5. The manufacturing method of the photovoltaic cell packaging structure of this embodiment includes the step S01 to the step S07. The step S01 is coating a packaging layer on a side of a first transparent cover or a side of a second transparent cover. The step S02 is baking the packaging layer to connect the packaging layer with the first transparent cover or the second transparent cover. The step S03 is attaching an adhesive layer to the side of the first transparent cover or the side of the second transparent cover. The step S04 is aligning the first transparent cover and the second transparent cover. The step S05 is placing the first transparent cover, the second transparent cover, the packaging layer, and the adhesive layer into a vacuum environment. The step S06 is heating and pressing the first transparent cover and the second transparent cover to connect the adhesive layer with the first transparent cover and the second transparent cover. The step S07 is heating the packaging layer to connect the packaging layer with the first transparent cover and the second transparent cover. The manufacturing method of this embodiment may manufacture any of those embodiments of the photovoltaic cell packaging structure 1. Here is not intended to be limiting. The manufacturing method of this embodiment may also manufacture other different photovoltaic cell packaging structures.

In the step S01, the packaging layer 50 is coated on the side 11S of the first transparent cover 11 or the side 12S of the second transparent cover 12. The packaging layer 50 may be, for example, the glass glue. The packaging layer 50 may be coated on the side 11S of the first transparent cover 11 or the side 12S of the second transparent cover 12 through a dispensing machine (coating machine). In some embodiment, the packaging layer 50 may be coated with a thickness 50D of equal to or greater than 15 μm and equal to or less than 25 μm on the side 11S of the first transparent cover 11 or the side 12S of the second transparent cover 12.

In the step S02, the packaging layer 50 is baked to connect the packaging layer 50 with the first transparent cover 11 or the second transparent cover 12. In some embodiment, the packaging layer 50 may be baked at a temperature of equal to or greater than 200 and equal to or less than 500° C. for equal to or greater than 90 minutes and equal to or less than 120 minutes to make the thickness 50D of the packaging layer 50 be equal to or greater than 18 μm and equal to or less than 22 μm, to connect the packaging layer 50 with the first transparent cover 11 or the second transparent cover 12.

In some embodiments, the first transparent cover 11 or the second transparent cover 12 and the packaging layer 50 may be placed into a normal temperature environment to make the first transparent cover 11 or the second transparent cover 12 and the packaging layer 50 cool down to normal temperature.

In the step S03, the adhesive layer 60 is attached to the side 11S of the first transparent cover 11 or the side 12S of the second transparent cover 12. In some embodiments, the adhesive layer 60 is a polyolefin elastomer (POE) disposed peripherally on the first transparent cover 11 or the second transparent cover 12. The polyolefin elastomer is a dry film that may be cut and used, and the thickness of the polyolefin elastomer may be uniformly controlled to facilitate subsequent heating operations.

It is worth noting that the packaging layer 50 may be coated on the first transparent cover 11 or the second transparent cover 12, and the adhesive layer 60 may also be coated on the first transparent cover 11 or the second transparent cover 12. Therefore, there are at least four combinations as follows: The packaging layer 50 and the adhesive layer 60 are both coated on the first transparent cover 11. The packaging layer 50 and the adhesive layer 60 are both coated on the second transparent cover 12. The packaging layer 50 is coated on the first transparent cover 11 and the adhesive layer 60 is coated on the second transparent cover 12. The packaging layer 50 is coated on the second transparent cover 12 and the adhesive layer 60 is coated on the first transparent cover 11.

In some embodiments, a thickness 60D of the adhesive layer 60 is 1.0 times to 2.0 times greater than a thickness 50D of the packaging layer 50. The thickness 60D may be, for example, equal to or greater than 35 μm and equal to or less than 45 μm. Here is not intended to be limiting. When the thickness 60D of the adhesive layer 60 is 1.0 times to 2.0 times greater than a thickness 50D of the packaging layer 50, the overflow area of the adhesive layer 60 is smaller during lamination. As a result, the usage of the adhesive layer 60 is less. The adhesive layer 60 influences or covers the glass glue of the packaging layer 50 may be prevented. The adhesive layer 60 affects the sintering effect between the glass glue, the first transparent cover 11 and the second transparent cover 12 may be prevented. If the thickness 60D of the adhesive layer 60 is less than the thickness 50D of the packaging layer 50, then the adhesive layer 60 may not be able to attach (bond) the first transparent cover 11 and the second transparent cover 12. As a result, the adhesive layer 60 may not temporarily attach the first transparent cover 11 and the second transparent cover 12 and maintain the packaging area 51 in the vacuum state.

In the step S04, the first transparent cover 11 and the second transparent cover 12 are aligned. The first transparent cover 11 and the second transparent cover 12 may be, for example, aligned through a fixed fixture. In some embodiments, the second transparent cover 12 may be in contact with the first upper conductive layer 41 to facilitate alignment.

In the step S05, the first transparent cover 11, the second transparent cover 12, the packaging layer 50, and the adhesive layer 60 are placed into a vacuum environment. The first transparent cover 11, the second transparent cover 12, the packaging layer 50 and the adhesive layer 60 may be placed in the vacuum laminating machine first. Then, the vacuuming is performed and the air pressure in the cavity of the vacuum laminating machine is lower than $10^{-1}$ Torr.

In the step S06, the first transparent cover 11 and the second transparent cover 12 are heated and pressed to connect the adhesive layer 60 with the first transparent cover 11 and the second transparent cover 12. In some embodiments, the first transparent cover 11 and the second transparent cover 12 may be heated and pressed at the temperature of equal to or greater than 80° C. and equal to or less than 150° C. for equal to or greater than 5 minutes and less than or equal to and equal to or less than 10 minutes to make the thickness 60D of the adhesive layer 60 be same with the thickness 50D of the packaging layer 50 to connect the adhesive layer 60 with the first transparent cover 11 and the second transparent cover 12. The thickness 60D and the thickness 50D, for example, 20 μm.

In some embodiments, the first transparent cover 11, the second transparent cover 12, the packaging layer 50, and the adhesive layer 60 may be placed into the normal pressure environment. Since the adhesive layer 60 temporarily attaches the first transparent cover 11 and the second transparent cover 12 and maintains the packaging area 51 in the vacuum state, the subsequent steps may be performed in a normal pressure environment to reduce the complexity of the process.

In the step S07, the packaging layer 50 is heated to connect the packaging layer 50 with the first transparent cover 11 and the second transparent cover 12. The heating method may be, for example, laser heating, which may not destroy the first photovoltaic unit 31 and may make the packaging layer 50 be welded (fused) with the first transparent cover 11 and the second transparent cover 12.

Figure 6:
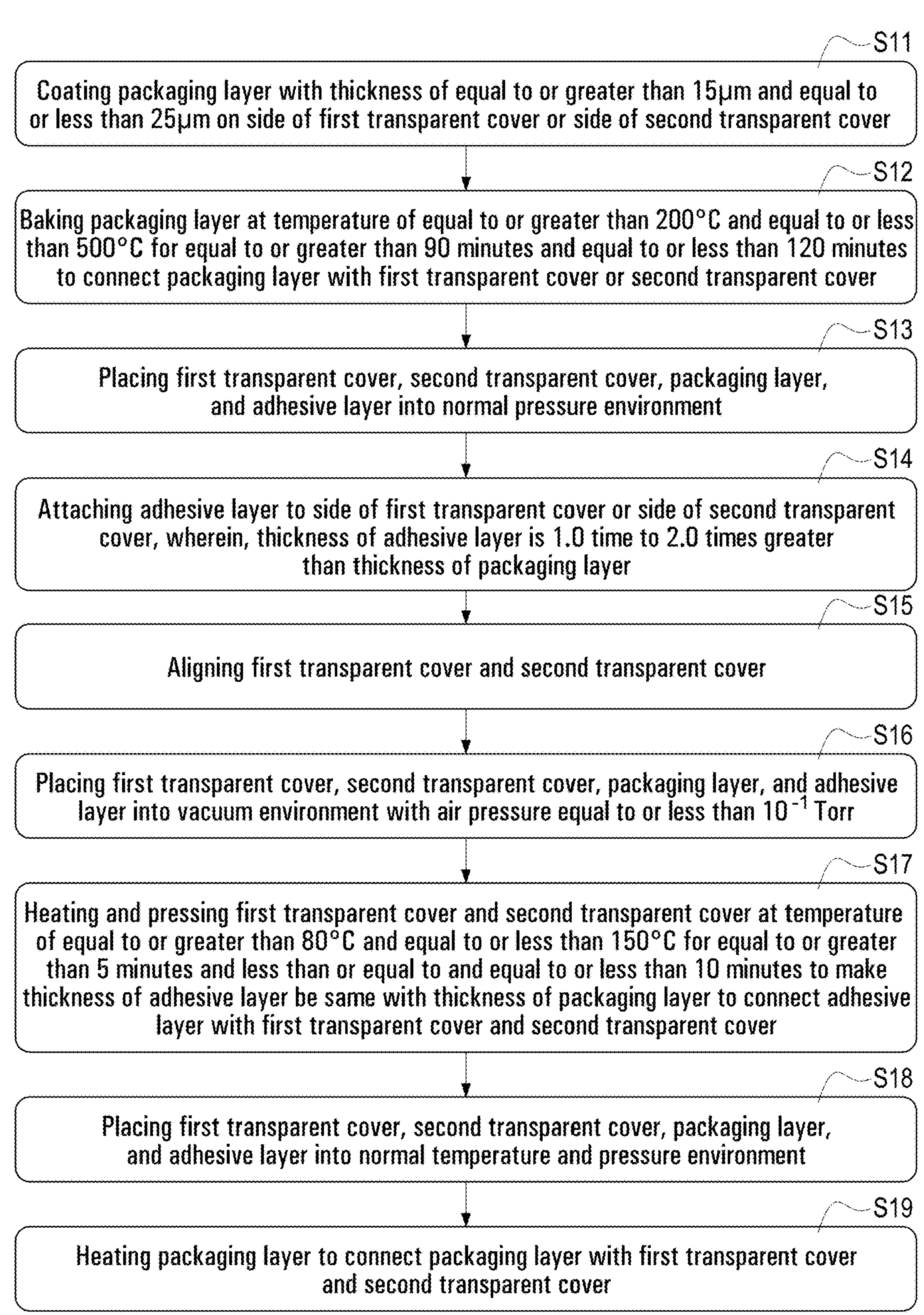
FIG. 6 is a flowchart of the manufacturing method of the photovoltaic cell packaging structure in accordance with another embodiment of the present disclosure.

FIG. 6 is a flowchart of the manufacturing method in accordance with another embodiment of the present disclosure. Please refer to FIG. 6, the manufacturing method of the photovoltaic cell packaging structure of this embodiment includes the step S11 to the step S19. The step S11 is coating the packaging layer with a thickness of equal to or greater than 15 and equal to or less than 25 μm on the side of the first transparent cover or the side of the second transparent cover. The step S12 is baking the packaging layer at a temperature of equal to or greater than 200 and equal to or less than 500° C. for equal to or greater than 90 minutes and equal to or less than 120 minutes to connect the packaging layer with the first transparent cover or the second transparent cover. The step S13 is placing the first transparent cover, the second transparent cover, the packaging layer, and the adhesive layer into a normal pressure environment. The step S14 is attaching the adhesive layer to the side of the first transparent cover or the side of the second transparent cover, wherein, the thickness of the adhesive layer is 1.0 times to 2.0 times greater than the thickness of the packaging layer. The step S15 is aligning the first transparent cover and the second transparent cover. The step S16 is placing the first transparent cover, the second transparent cover, the packaging layer, and the adhesive layer into the vacuum environment with an air pressure equal to or less than $10^{-1}$ Torr. The step S17 is heating and pressing the first transparent cover and the second transparent cover at a temperature of equal to or greater than 80 and equal to or less than 150° C. for equal to or greater than 5 minutes and less than or equal to and equal to or less than 10 minutes to make a thickness of the adhesive layer be same with a thickness of the packaging layer to connect the adhesive layer with the first transparent cover and the second transparent cover. The step S18 is placing the first transparent cover, the second transparent cover, the packaging layer, and the adhesive layer into a normal pressure environment. The step S19 is heating the packaging layer to connect the packaging layer with the first transparent cover and the second transparent cover. The manufacturing method of this embodiment may manufacture any of those embodiments of the photovoltaic cell packaging structure 1. Here is not intended to be limiting. The manufacturing method of this embodiment may also manufacture other different photovoltaic cell packaging structures. The main differences between the manufacturing method of this embodiment and the previous embodiments are as follows.

The step S11 additionally discloses the thickness 50D of the packaging layer 50 before baking is equal to or greater than 15 μm and equal to or less than 25 μm. The step S12 additionally discloses the baking condition that the packaging layer 50 is baked at a temperature of equal to or greater than 200 and equal to or less than 500° C. for equal to or greater than 90 minutes and equal to or less than 120 minutes to make the thickness 50D of the packaging layer 50 be equal to or greater than 18 μm and equal to or less than 22 μm. The added step S13 additionally discloses that the first transparent cover 11 or the second transparent cover 12 and the packaging layer 50 are placed into the normal temperature environment so that the next step of attaching the adhesive layer 60 is easier to perform. The step S14 additionally discloses that the thickness 60D of the adhesive layer 60 is 1.0-2.0 times greater than the thickness 50D of the packaging layer 50. As a result, less of the adhesive layer 60 may be used and better results may be achieved. The step S15 is similar to the step S04. The step S16 additionally discloses that the air pressure of the vacuum environment is equal to or less than $10^{-1}$ torr. The step S17 additional discloses that the first transparent cover 11 and the second transparent cover 12 are heated at a temperature of equal to or greater than 80 and equal to or less than 150° C. for equal to or greater than 5 minutes and less than or equal to and equal to or less than 10 minutes to make a thickness 60D of the adhesive layer 60 be same with a thickness 50D of the packaging layer 50. The added step S18 additionally discloses that the first transparent cover 11, the second transparent cover 12, the packaging layer 50, and the adhesive layer 60 are placed in the normal pressure environment to reduce the complexity of the process. The step S19 is similar to the step S07.

In summary, the first transparent cover, the second transparent cover, the adhesive layer, and the packaging layer of the photovoltaic cell packaging structure of the present disclosure may maintain the vacuum of the packaging area to achieve the effect of blocking water and gas. The first upper conductive layer or the insulation layer may evenly support the first transparent cover and the second transparent cover inside the packaging area to make the structure of the photovoltaic cell packaging structure be stable and difficult to be deformed, make the thickness uniformity increase, and make the alignment of the first transparent cover and the second transparent cover be precise without additional filling layer material.

Moreover, the thickness of the adhesive layer of the photovoltaic cell packaging structure of the present disclosure is equal to or greater than 10 μm and equal to or less than 500 μm. As a result, the photovoltaic cell packaging structure may temporarily maintain the vacuum of the packaging area during manufacturing, and the packaging layer may be heated in a normal pressure environment. The thickness of the packaging layer is equal to or greater than 10 μm and equal to or less than 500 μm to support the first transparent cover and the second transparent cover. The thickness of the first upper conductive layer is equal to or greater than 0.1 μm and equal to or less than 500 μm and the thickness of the insulation layer is equal to or greater than 10 μm and equal to or less than 500 μm to evenly support the first transparent cover and the second transparent cover. The thickness of the first lower conductive layer is equal to or greater than 0.05 μm and equal to or less than 10 μm for being disposed inside the packaging area to facilitate manufacturing. The thickness of the first photovoltaic unit is equal to or greater than 0.1 μm and equal to or less than 10 μm for being disposed inside the packaging area to facilitate manufacturing.

The manufacturing method of the photovoltaic cell packaging structure of the present disclosure is using the adhesive layer to temporarily bond the first transparent cover and the second transparent cover and maintain the packaging area in the vacuum state. As a result, the packaging layer may be heated in the normal pressure environment to reduce the complexity of the laser heating process. The packaging area may be maintained in a vacuum state of at least $10^{-1}$ Torr to achieve the effect of water and gas blocking. The alignment error of the first transparent cover and the second transparent cover may be controlled to equal to or less than 5 μm.

As used herein and not otherwise defined, the terms "substantially" and "approximately" are used to describe and account for small variations. When used in conjunction with an event or circumstance, the terms may refer to instances in which the event or circumstance occurs precisely as well as instances in which the event or circumstance occurs to a close approximation. For example, when used in conjunction with a numerical value, the terms may refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While this disclosure has been described by means of specific embodiments, numerous modifications and variations may be made thereto by those skilled in the art without departing from the scope and spirit of this disclosure set forth in the claims.

What is claimed is:

1. A photovoltaic cell packaging structure, comprising:

a first transparent cover;

a first lower conductive layer, disposed on a side of the first transparent cover;

a first photovoltaic unit, disposed on a side of the first lower conductive layer;

a first upper conductive layer, disposed on a side of the first photovoltaic unit;

a packaging layer, disposed peripherally on the first transparent cover, wherein the packaging layer is formed by sintering with glass glue;

an adhesive layer, disposed peripherally on the first transparent cover and disposed adjacent to the packaging layer; and a second transparent cover, disposed on the packaging layer and the adhesive layer, and contacting with the first upper conductive layer;

wherein, a packaging area is defined by the first transparent cover, the second transparent cover, and the packaging layer.

2. The photovoltaic cell packaging structure of claim 1, wherein, the adhesive layer is disposed inside the packaging layer and arranged in the packaging area.

3. The photovoltaic cell packaging structure of claim 1, wherein, the adhesive layer is disposed outside the packaging layer and arranged outside the packaging area.

4. The photovoltaic cell packaging structure of claim 1, wherein, a thickness of the adhesive layer is 10 μm-500 μm.

5. The photovoltaic cell packaging structure of claim 4, wherein, a thickness of the packaging layer is 10 μm-500 μm.

6. The photovoltaic cell packaging structure of claim 1, wherein, a thickness of the first upper conductive layer is 0.1 μm-500 μm.

7. The photovoltaic cell packaging structure of claim 1, wherein, a thickness of the first lower conductive layer is 0.05 μm-10 μm.

8. The photovoltaic cell packaging structure of claim 1, wherein, a thickness of the first photovoltaic unit is 0.1 μm-10 μm.

9. The photovoltaic cell packaging structure of claim 1, further comprising:

a second lower conductive layer, disposed on the side of the first transparent cover, disposed adjacent to the first lower conductive layer, and electrically connected to the first upper conductive layer;

a second photovoltaic unit, disposed on a side of the second lower conductive layer; and an insulation layer, disposed between the first photovoltaic unit and the second photovoltaic unit;

wherein, a thickness of the insulation layer is 0.1 μm-500 μm.

10. The photovoltaic cell packaging structure of claim 1, wherein, the adhesive layer is a polyolefin elastomer (POE), an ionomer, an ethylene vinyl acetate (EVA), a polyurethane (PU), a polyvinyl butyral (PVB), or a polyisobutylene (PIB).

11. The photovoltaic cell packaging structure of claim 1, further comprising:

a reflective layer, disposed on the first photovoltaic unit.

12. The photovoltaic cell packaging structure of claim 1, further comprising:

a gas suction unit, disposed in the packaging area.

* * * * *